(12) United States Patent
Okudaira

(10) Patent No.: US 6,407,419 B1
(45) Date of Patent: Jun. 18, 2002

(54) SEMICONDUCTOR DEVICE AND MANUFACTURING METHOD THEREOF

(75) Inventor: Tomonori Okudaira, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/362,669

(22) Filed: Jul. 29, 1999

(30) Foreign Application Priority Data

Jan. 8, 1999 (JP) ............................................. 11-002763

(51) Int. Cl.[7] ..................... H01L 27/108; H01L 29/76; H01L 29/94
(52) U.S. Cl. ..................... 257/295; 257/296; 257/298; 257/310; 257/311
(58) Field of Search ................................. 257/295, 296, 257/298, 310, 311

(56) References Cited

U.S. PATENT DOCUMENTS

| | | | | |
|---|---|---|---|---|
| 5,335,138 A | * | 8/1994 | Sandhu et al. | 361/303 |
| 5,796,573 A | * | 8/1998 | Kotechi et al. | 361/321.5 |
| 5,808,854 A | * | 9/1998 | Figura et al. | 361/321.4 |
| 5,874,364 A | * | 2/1999 | Nakabayashi et al. | 438/738 |
| 5,883,781 A | * | 3/1999 | Yamamichi et al. | 361/321.4 |
| 5,952,687 A | * | 9/1999 | Kawakubo et al. | 257/296 |
| 6,020,233 A | * | 2/2000 | Kim | 438/240 |
| 6,075,264 A | * | 6/2000 | Koo | 257/295 |

FOREIGN PATENT DOCUMENTS

JP 9-64298 3/1997

OTHER PUBLICATIONS

"Dry Etching of Ruthenium with O2/Cl2/CF4 Gas Plasma", M. Matsushita et al., Extended Abstracts (The 43$^{rd}$ Spring Meeting, 1996); The Japan Society of Applied Physics and Related Societies. (With English Abstract).

* cited by examiner

Primary Examiner—Olik Chaudhuri
Assistant Examiner—Shrinivas H. Rao
(74) Attorney, Agent, or Firm—McDermott, Will & Emery

(57) ABSTRACT

A semiconductor device preventing contact between a capacitor insulator and a plug material even when an upper surface of the plug is exposed by misregistration in lithography and manufacturing method thereof are obtained. The semiconductor device includes an interlayer insulating film, a conducting plug, a capacitor lower electrode and a capacitor dielectric, and an end portion of the upper surface of the conducting plug has a portion overlapping a vicinity of an outer periphery of the upper surface of the capacitor lower electrode when viewed two-dimensionally. In the vicinity of the end portion of the upper surface of the conducting plug, a chemically inactive member is formed.

9 Claims, 15 Drawing Sheets

SEMICONDUCTOR DEVICE AND MANUFACTURING METHOD THEREOF

BACKGROUND OF THE INVENTION

1. Field of the Invention

The present invention relates to a semiconductor device and manufacturing method thereof, and more particularly, to a capacitor electrode structure used in a semiconductor memory device and manufacturing method thereof.

2. Description of the Background Art

Generally, a precious metal such as Pt, Ru or Ir or an oxide thereof is used for a lower electrode of a high dielectric capacitor of a semiconductor memory device. Electrical connection between the capacitor lower electrode and the semiconductor substrate is attained by forming a conducting plug formed of an impurity-doped polycrystalline silicon (polysilicon) therebetween, or alternatively, in order to ensure conduction with the conducting plug, by forming a barrier metal layer containing, as a main component, a refractory metal or metal having high melting point, such as Ti, Ta or W on a lower surface of the capacitor lower electrode.

FIG. 35 represents a conventional semiconductor device including a high dielectric capacitor. The semiconductor device includes an isolating insulating film 502 and an active region 503 at a main surface of a semiconductor substrate 501 and connected to other circuit portions by a word line 504 and a bit line 505. These portions are covered by an interlayer insulating film 506 to prevent a short-circuit. On active region 503, a conducting plug 507 is formed filling a contact hole penetrating through interlayer insulating film 506, and on conducting plug 507, capacitor lower electrode 528 is formed, as described above. On capacitor lower electrode 528 and interlayer insulating film 506, a capacitor dielectric 511 is formed and a capacitor upper electrode 512 is further formed thereon, providing a capacitor.

In the above described semiconductor device including the high dielectric capacitor, along with the increase in the degree of integration, the area of the capacitor lower electrode has been so reduced as to cause problems which cannot be addressed by the present lithography precision. More specifically, the upper surface of the conducting plug comes to be not fully covered by the capacitor lower electrode. In such a case, the capacitor dielectric and the conducting plug may unavoidably contact with each other or, even when not brought into contact, the dielectric and the conducting plug may be positioned to close to each other. In the following description, the expression that the upper surface of the conducting plug and the capacitor dielectric "contact with each other" refers to an actual contact as well as an arrangement in which the upper surface and the capacitor dielectric are positioned very close to each other though not in actual contact.

Generally, the conductive material for forming conducting plug 507 has, though slightly, a reducing property, as it contains a metal nitride as a main component. The high dielectric material used for capacitor dielectric 511 involves an oxide of Ba, Sr, Ti, Bi, Pb, Zr or the like.

When the capacitor dielectric 511 and conducting plug 507 contact with each other as mentioned above, a chemical reaction between the material of the conducting plug and the material of the capacitor insulator is induced near an interface therebetween during the step of heating. More specifically, the oxide forming the capacitor dielectric is reduced by the metal nitride forming the conducting plug, resulting in oxygen depleted region in the oxide. This means that a region 600 having poor insulation is formed in the capacitor dielectric, and therefore the insulation characteristic of the capacitor degrades (FIG. 35). Degraded insulation characteristic leads to leakage of charges stored in the capacitor, possibly causing defects in memory retention of the semiconductor memory device. Further, capacitor capacitance decreases and controllability of the capacitor electrode degrades.

When the capacitor dielectric and the conducting plug are in contact with each other or very close to each other, an end portion of the upper surface of the conducting plug has a portion not covered by the capacitor lower electrode but exposed, or a portion not yet but about to be exposed, positioned very close to an outer peripheral line on the lower surface of the capacitor lower electrode, in the manufacturing step where the capacitor lower electrode is formed during manufacturing the semiconductor device. Therefore, in the following description, the situation in which an end portion of the upper surface of the conducting plug "contacts" the capacitor dielectric and a situation in which the end portion of the upper surface is "positioned very close" to the capacitor dielectric, though not actually, in contact also refer to the situation where the end portion is respectively "exposed" and "almost exposed", and the situation where the end portion is "exposed" also includes a situation where the upper surface of the conducting plug and the capacitor dielectric are "very close", unless indicated otherwise.

SUMMARY OF THE INVENTION

An object of the present invention is to provide a semiconductor device in which the capacitor dielectric and the conducting plug are separated from each other by such a distance that prevents chemical reaction therebetween even when the end portion of an upper surface of the conducting plug is exposed because of misregistration in lithography, and to provide a manufacturing method thereof.

According to a first aspect, the present invention provides a semiconductor device including an interlayer insulating film formed on a main surface of a semiconductor substrate, a conducting plug formed in a contact hole penetrating through the interlayer insulating film, a capacitor lower electrode formed on the conducting plug and on the interlayer insulating film, and a capacitor dielectric formed to cover the capacitor lower electrode and the interlayer insulating film, wherein an end portion on the upper surface of the conducting plug which is closer to a sidewall of the capacitor lower electrode has a portion overlapping the vicinity of an outer periphery of an upper surface of the capacitor lower electrode when viewed two-dimensionally, and a chemically inactive member is formed in the vicinity of the end portion of the upper surface of the conducting plug between and separating the end portion of the conducting plug and the capacitor dielectric.

In the specification, the "chemically inactive material" forming the chemically inactive member refers to an insulator such as an oxide or a nitride or a precious metal (precious metal of a single element such as Pt, an alloy of precious metals such as PtIr, an alloy of a precious metal and a metal, a precious metal containing O or the like, a compound of the precious metal containing O or the like, or a mixture of the precious metal and the compound such as PtOx, a mixture of Pt and $PtO_2$ or the like).

As described above, when a chemically inactive material is formed in the vicinity of an end portion having the overlapping portion at the upper surface of the conductive plug, the capacitor dielectric and the conducting plug can be separated from each other with a sufficient distance therebetween. Therefore, there is no possibility of chemical reaction between the capacitor dielectric and the conducting plug, and superior insulation characteristic of the capacitor dielectric is ensured. Therefore, during the operation of the semiconductor device in accordance with the present invention, stored charges are never leaked, and memory retention is surely maintained. Further, decrease in capacitor capacitance or degraded controllability of the capacitor are not experienced. Here, "vicinity of an end portion" encompasses the end portion itself and its periphery.

In the semiconductor device in accordance with the first aspect described above, in some cases where miniaturization proceeds exceeding the lithography precision, the above described end portion at the upper surface of the conducting plug has a portion extended out from an outer periphery of the upper surface of the capacitor lower electrode, when viewed two-dimensionally.

When the end portion of the upper surface of the conducting plug has a portion extended out of the outer periphery of the upper surface of the capacitor lower electrode when viewed two-dimensionally, it means that the end portion has a portion which is brought into contact with the capacitor dielectric, unless there is formed a chemically inactive member in the vicinity of the end portion. In the semiconductor device in accordance with the first aspect, there is a chemically inactive member existing between the end portion and the capacitor dielectric, and therefore chemical reaction in the subsequent step of heating can be prevented. Therefore, even when there is a misregistration at the time of lithography, the capacitor dielectric having superior insulation characteristic can be maintained. More specifically, even when there is variation in the step of lithography, the semiconductor device of the present invention is free of leakage of stored charges, with less-variation-influenced controllability and capacitances of capacitor.

Further, in another situation where miniaturization proceeds exceeding lithography precision, the end portion of the upper surface of the conducting plug has the aforementioned overlapping portion and is within a region on the upper surface of the capacitor lower electrode, when viewed two-dimensionally.

Even in this case, in which the end portion having the overlapping portion at the upper surface of the conducting plug is within the region of the upper surface of the capacitor lower electrode when viewed two-dimensionally, chemical reaction occurs through the capacitor lower electrode or the interlayer insulating film, if the capacitor dielectric and the conducting plug are at a close distance. In this case also, as in the semiconductor device in accordance with the first aspect described above, it becomes possible to prevent chemical reaction by forming a chemically inactive member in the vicinity of the end portion having the overlapping portion at the upper surface of the conducting plug to separate the conducting plug from the capacitor dielectric with a sufficient distance. As a result, a capacitor dielectric having superior insulation characteristic is provided.

In the semiconductor device in accordance with the first aspect described above, preferably, an insulator which is a compound of a material constituting the conducting plug is formed as a chemically inactive member, at the end portion of the upper surface of the conducting plug.

As an insulating member is formed by a chemical reaction of oxygen or the like with the material constituting the conducting plug at the end portion having the overlapping portion of the upper surface of the conducting plug, the capacitor dielectric and the conducting plug are separated from each other with a sufficient distance. Therefore, in the step of heating after the capacitor is formed, degradation of the insulating characteristic of the capacitor dielectric caused by a chemical reaction is prevented. More specifically, an insulating member can be formed surely in a simple manner.

In the semiconductor device in accordance with the first aspect described above, the capacitor lower electrode tapered to be wider from the upper surface toward the lower surface preferably covers, as a chemically inactive member, the end portion of the upper surface of the conducting plug.

As the capacitor lower electrode tapered to be wider from the upper to the lower surface covers, as an inactive material, the end portion having the overlapping portion of the upper surface of the conducting plug, it becomes possible to separate the capacitor dielectric from the conducting plug with sufficient distance kept therebetween. As a result, degradation of insulating characteristic of the capacitor dielectric can be prevented, while eliminating the possibility of increased electrical resistance at the connecting portion between the upper surface of the conducting plug and the capacitor lower electrode.

In the semiconductor device in accordance with the first aspect, a chemically inactive sidewall extension is desirably formed as an inactive member on a side surface portion of the capacitor lower electrode to cover the end portion of the upper surface of the conducting plug.

Maximum width of the end portion of the upper surface of the conducting plug extended out from the boundary on the upper surface of the capacitor lower electrode is, in cross section, generally about 0.1 μm. Therefore, when the sidewall extension is formed on the side surface portion of the capacitor lower electrode, it becomes possible to separate the capacitor dielectric from the conducting plug by a sufficient distance. As the sidewall extension is formed by a chemically inactive material, chemical reaction between the capacitor dielectric and the conducting plug is prevented, and hence superior insulating characteristic of the capacitor dielectric is not impaired.

In the semiconductor device in accordance with the first aspect of the present invention described above, desirably, the capacitor lower electrode is formed of a barrier metal layer and a precious metal layer, and further, the chemically inactive metal is formed additionally on the side surface of the barrier metal layer so that the member is interposed between the barrier metal layer and the capacitor dielectric to separate these from each other.

As already described, the precious metal refers to a precious metal of a single element such as Pt, an alloy of precious metals such as PtIr, an alloy of a precious metal and a metal, a precious metal containing O or the like or a compound thereof or a mixture thereof, for example, $PtO_x$, a mixture of Pt and $PtO_2$.

As described above, the chemically inactive material is formed on the sidewall of the barrier metal in addition to the vicinity of the end portion having the overlapping portion of the upper surface of the conducting plug, and therefore the capacitor dielectric can be separated at both portions. As a result, chemical reaction of the capacitor dielectric can be prevented both in the vicinity of the interface between the capacitor dielectric and the barrier metal sidewall and in the vicinity of the interface between the capacitor dielectric and the end portion of the upper surface of the conducting plug.

More specifically, the insulating characteristic of the capacitor dielectric is not degraded at both interfaces, and therefore the charges stored in the capacitor dielectric never leaks. Further, decrease of the capacitor capacitance or degradation of the controllability of the capacitor is not experienced either.

In the semiconductor device in accordance with the first aspect having a barrier metal layer on the capacitor lower electrode, desirably, the chemically inactive material formed on the sidewall of the barrier metal is an insulator formed of a compound of a material constituting the barrier metal formed on the sidewall of the barrier metal, and the chemically inactive member formed on the end portion of the upper surface of the conducting plug is an insulator formed of a compound of a material constituting the conducting plug, formed on the end portion of the upper surface of the conducting plug.

As the insulator formed of a compound of the material constituting the barrier metal and an insulator formed of the compound of the material constituting the conducting plug are formed as the chemically inactive members at prescribed positions, degradation of the insulating characteristic of the capacitor dielectric can surely be prevented in a simple manner.

In the semiconductor device described above, desirably, the chemically inactive member formed at the end portion of the upper surface of the conducting plug and on the sidewall of the barrier metal is a sidewall extension formed so as to cover the end portion of the upper surface of the conducting plug, at the side surface portion of the capacitor lower electrode, formed of a barrier metal layer and precious metal layer.

By the provision of the above described chemically inactive sidewall extension, it becomes possible to separate the portion causing a chemical reaction with the capacitor dielectric in the subsequent step of heating can be separated with a sufficient distance. Therefore, it becomes possible to maintain the superior insulating characteristic of the capacitor dielectric, while eliminating the possibility of increase in electrical resistance at the connecting portion between the capacitor lower electrode and the conducting plug.

The method of manufacturing a semiconductor device in accordance with the present invention includes the steps of forming an interlayer insulating film on a main surface of a semiconductor substrate, forming a conducting plug by filling a conducting material in a contact hole penetrating through the interlayer insulating film, forming a capacitor lower electrode layer on the conducting plug and the interlayer insulating film, forming a resist pattern of the capacitor lower electrode on the capacitor lower electrode layer such that the vicinity of the outer periphery of the lower surface thereof and an end portion of an upper surface of the conducting plug are arranged overlapping with each other when viewed two-dimensionally, forming the capacitor lower electrode by etching the capacitor lower electrode layer using the resist pattern as a mask, and forming the capacitor dielectric layer to cover the interlayer insulating film and the capacitor lower electrode, which method further includes, preceding the step of forming the capacitor dielectric layer, the step of forming a chemically inactive material in the vicinity of the end portion of the upper surface of the conducting plug so that the member is interposed between the end portion of the upper surface of the conducting plug and the capacitor dielectric layer to separate these from each other.

When the end portion of the upper surface of the conducting plug has a portion overlapping with the vicinity of an outer periphery of the lower surface of the capacitor lower electrode, the chemically inactive member is formed at the end portion, and therefore, the conducting plug and the capacitor dielectric can be separated with a sufficient distance therebetween. Therefore, chemical reaction with the capacitor dielectric and the conducting plug in the subsequent step of heating can be prevented. As a result, even if the end portion of the upper surface of the conducting plug is exposed because of misregistration in lithography, superior insulation characteristic of the capacitor dielectric can be maintained.

In the method of manufacturing a semiconductor device of the present invention described above, desirably, in the step of forming a chemically inactive material, a sidewall extension formed of a chemically inactive material is formed to cover the end portion of the upper surface of the conducting plug, on a side surface portion of the capacitor lower electrode.

By the aforementioned sidewall extension, it becomes possible to separate the capacitor dielectric and the conducting plug from each other with a sufficient distance. Therefore, degradation of the insulating characteristic of the capacitor dielectric caused by a chemical reaction between the capacitor dielectric and the conducting plug in the subsequent step of heating can be avoided.

In the method of manufacturing a semiconductor device in accordance with the present invention, desirably, the step of forming the capacitor lower electrode layer includes the step of forming a barrier metal layer, which is a lower layer of the capacitor lower electrode layer, and forming a precious metal layer which is an upper layer of the capacitor lower electrode layer, and said step of forming a chemically inactive member is desirably a step of forming the chemically inactive member both at a sidewall of the barrier metal and in the vicinity of the end portion of the upper surface of the conducting plug such that the member is interposed between the barrier metal sidewall of the capacitor lower electrode and the capacitor dielectric layer and between the end portion of the upper surface of the conducting plug and the capacitor dielectric layer to separate respective elements from each other.

As described above, the chemically inactive material is formed both on the barrier metal sidewall and in the vicinity of the end portion of the upper surface of the conducting plug, these portions can be separated from the capacitor dielectric by sufficient distances. As a result, degradation of the insulating characteristic of the capacitor dielectric derived from a chemical reaction in the subsequent step of heating can be prevented.

In the method of manufacturing a semiconductor device of the present invention, desirably, by the step of forming a chemically inactive member, a chemically inactive sidewall extension is formed to cover the end portion of the upper surface of the conducting plug, on a side surface portion of the capacitor lower electrode formed of a barrier metal layer and a precious metal layer.

As the chemically inactive sidewall extension is formed to cover the end portion of the upper surface of the conducting plug on the side surface portion of the capacitor lower electrode, it becomes possible to separate the capacitor dielectric from the barrier metal and from the conducting plug by a sufficient distance. As a result, degradation of the insulating characteristic of the capacitor dielectric derived from the chemical reaction between the capacitor dielectric and the barrier metal sidewall or the conducting plug can be prevented.

The method of manufacturing a semiconductor device in accordance with another aspect includes the steps of forming an interlayer insulating film on a main surface of a semiconductor substrate, forming a conducting plug by filling a conducting material in a contact hole penetrating through the interlayer insulating film, forming a capacitor lower electrode layer on the conducting plug and on the interlayer insulating film, forming a capacitor lower electrode resist pattern on the capacitor lower electrode layer, and forming a capacitor lower electrode having its side surface tapered to be wider from the upper to the lower surface, by etching the capacitor lower electrode layer using the resist pattern as a mask.

As the capacitor lower electrode having the side surface tapered to be wider from the upper to the lower surface is formed, the conducting plug and the capacitor dielectric can be separated from each other even when there is a misalignment of the resist pattern to some extent. As a result, degradation of the insulating characteristic of the capacitor dielectric derived from a chemical reaction in the subsequent step of heating can be avoided. Therefore, the present invention provides a stable method of manufacturing a high quality semiconductor device, which is less susceptible to the influence of misregistration of the resist pattern.

In the method of manufacturing a semiconductor device in accordance with another aspect of the present invention, desirably, the vicinity of the outer periphery of the lower surface of the capacitor lower electrode resist pattern has a portion overlapping with the end portion of the upper surface of the conducting plug when viewed two-dimensionally, and the step of forming the tapered capacitor lower electrode is performed such that the end portion of the upper surface of the conducting plug is covered.

As the capacitor lower electrode tapered to be wider is formed to cover the end portion of the upper surface of the conducting plug, the capacitor dielectric and the conducting plug can be separated from each other. Therefore, degradation in insulating characteristic of the capacitor dielectric derived from a chemical reaction in the subsequent step of heating can be prevented.

Further, in the method of manufacturing a semiconductor device in accordance with the aforementioned another aspect of the present invention, desirably, the capacitor lower electrode layer is formed of a precious metal, and the step of forming the capacitor lower electrode tapered to be wider includes the step of tapering the capacitor lower electrode, utilizing a phenomenon in which during etching of the capacitor lower electrode layer, once etched and scattered etch material of the capacitor lower electrode layer is re-deposited on the side surface portion of the etch material and the resist pattern when the flow rate of the etching gas is lowered.

As described above, the phenomenon of re-deposition of the etch material once etched and vaporized is utilized, it becomes possible to form a capacitor lower electrode tapered widely to cover the end portion of the upper surface of the conducting plug in a simple manner. As a result, the capacitor lower electrode and the capacitor dielectric can be separated from each other, and degradation in insulating characteristic of the capacitor dielectric derived from a chemical reaction between the capacitor dielectric and the conducting plug in the subsequent step of heating can be prevented.

When the capacitor lower electrode is formed of ruthenium, which is a precious metal, in the method of manufacturing a semiconductor device in accordance with the aforementioned another aspect of the present invention, desirably, the etching of the capacitor lower electrode layer is performed under the following conditions: main component of the etching gas is a mixed gas of oxygen and chlorine with the chlorine concentration being 2.5 to 20%, total gas flow rate is at least 400 sccm, discharging pressure is 10 to 50 mTorr, and gas residence time is at most 45 msec.

The magnitude of the taper angle is determined by two factors, that is, the length of the gas residence time and gas concentration (pressure). Therefore, it is important to define the taper angle by the gas residence time and the pressure. The flow rate is in reverse proportion to the gas residence time, and therefore the flow rate is determined uniquely once the gas residence time is determined. Therefore, it is difficult to control the taper angle using the total gas flow rate only as an index, because the gas residence time varies dependent on the evacuation rate, even if the taper angle is to be controlled by the total gas flow rate.

As the capacitor lower electrode layer formed of ruthenium is etched under the above described conditions, once etched ruthenium is redeposited on the side surface of the resist pattern and the capacitor lower electrode which is being etched. As a result, a capacitor lower electrode having a tapered side surface widening downward, covering the end portion of the upper surface of the conducting plug, can be formed. Therefore, the capacitor dielectric and the conducting plug are separated from each other by a sufficient distance. Because of this separation, there is no chemical reaction between the capacitor dielectric and the conducting plug in the subsequent step of heating, and therefore degradation of insulating characteristic of the capacitor dielectric can be prevented.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention will be described with reference to the drawings.

First Embodiment

Figure 1:
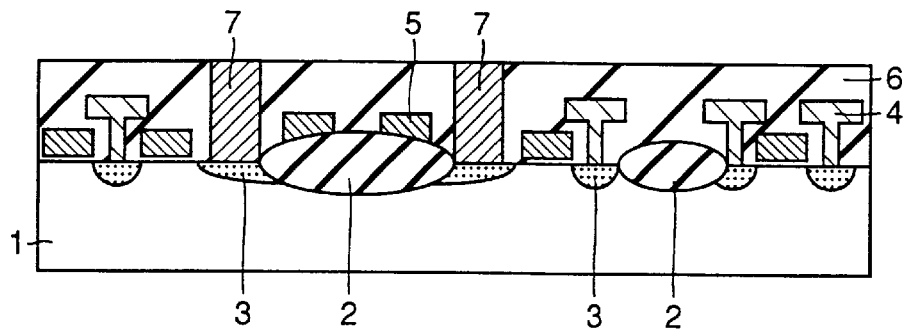
FIG. 1 is a cross sectional view of the semiconductor device in accordance with a first aspect in a step in which a capacitor underlying structure is formed.

FIG. 1 represents a structure in the step in which a conducting plug 7 is formed by filling a conductive material in a contact hole penetrating through an interlayer insulating film 6, in manufacturing the semiconductor device in accordance with the first embodiment. The structure of this intermediate stage includes a silicon substrate 1, an isolating insulating film 2, an active region 3, a word line 4, a bit line 5, an interlayer insulating film 6 and conducting plug 7. The material for forming the conducting plug 7 is a material containing silicon, titanium or nitride as a main component. However, other material may be used. Further, part of the conducting plug may be formed simultaneously with the bit line, so that the conducting plug has a stacked structure. When impurity doped polysilicon is used as a material for forming the conducting plug 7, the capacitor lower electrode, which will be described later, must have a two-layered structure of a precious metal layer (or a layer of its oxide) and a barrier metal layer. In FIG. 1, a well structure formed in the substrate is not shown.

Figure 2:
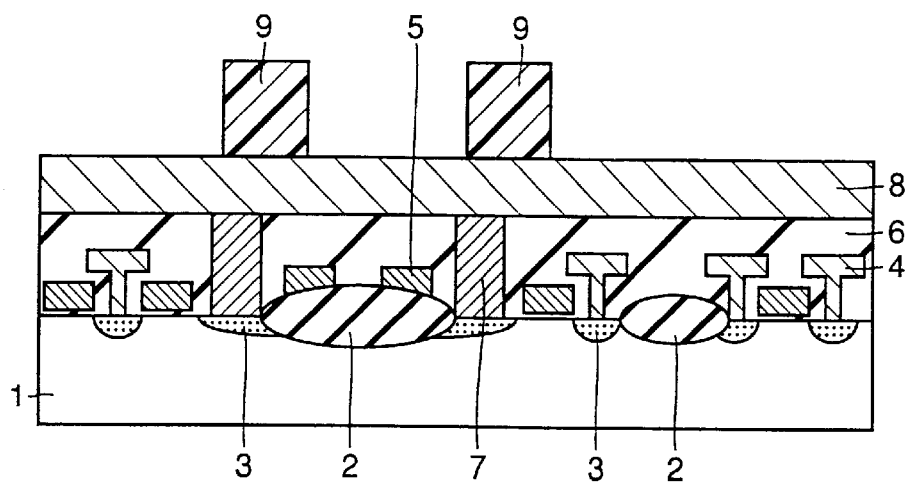
FIG. 2 is a cross sectional view in accordance with the first embodiment in a step in which the capacitor lower electrode layer and the resist pattern are formed.

Referring to FIG. 2, thereafter, a Pt film 8 for forming the capacitor lower electrode is formed by sputtering, for example, on interlayer insulating film 6 and conducting plug 7 to the thickness of 200 nm under the following conditions: temperature: 200° C., atmosphere: Ar, pressure: 0.2 Pa and power: 1kW. The method of forming the conducting layer for the lower electrode is not limited to sputtering. Further, the material of the conducting layer is not limited to Pt. For example, an impurity such as oxygen may be introduced to Pt, and materials other than Pt may be used provided that requirements such as electric conductivity and chemical stability are satisfied. Further, if an impurity doped polysilicon is used as a material of the conducting plug, two-layered structure including the Pt layer and the barrier metal layer is necessary.

Thereafter, on the Pt layer 8, a prescribed resist pattern 9 for the capacitor lower electrode is formed by lithography. At this time, because of misregistration in lithography, it is possible that vertically below the edge of the capacitor lower electrode resist pattern, an end portion of the upper surface of the conducting plug is positioned as shown in FIG. 2. Thereafter, using capacitor lower electrode resist pattern 9 as a mask, the Pt layer 8 is etched under the conditions of temperature: 300° C., atmosphere: Ar/Cl$_2$, and total pressure: 1.0 Pa, by using a helicon etcher, so that a capacitor lower electrode 28 is formed. When there is the misregistration in resist pattern 9, an end of the upper surface of conducting plug 7 exceeds the boundary of the lower surface of capacitor lower electrode 28 after patterning and is exposed.

Figure 3:
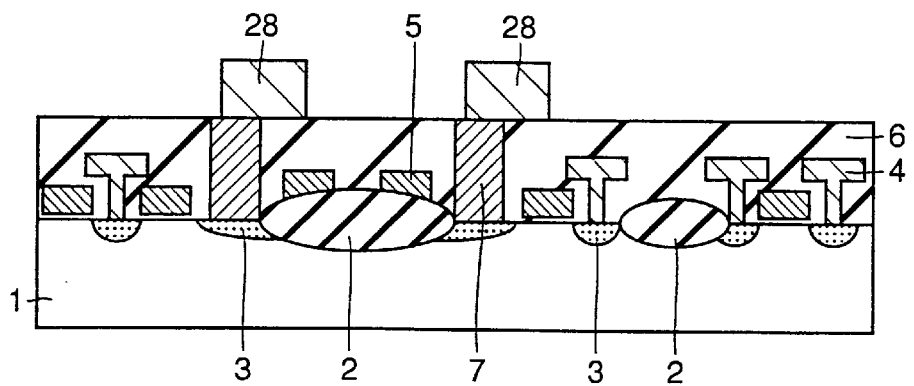
FIG. 3 is a cross sectional view in accordance with the first aspect in a step in which the capacitor lower electrode is formed.
Figure 4:
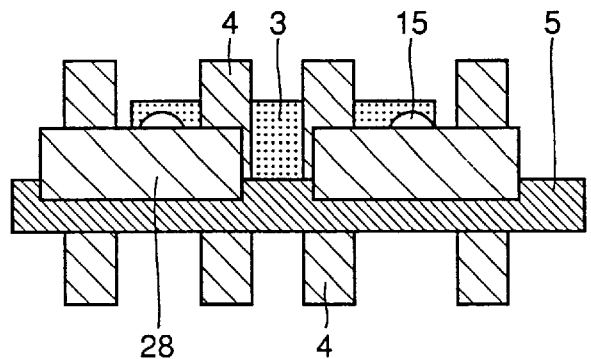
FIG. 4 is a schematic view of the structure of FIG. 3 viewed two-dimensionally.

FIG. 4 is a schematic plan view of the structure shown in FIG. 3, viewed from above. Referring to FIG. 4, a portion 15 at the end of an upper surface of the conducting plug is clearly identified as extending from an outer peripheral line of the upper surface of capacitor lower electrode 28.

Figure 5:
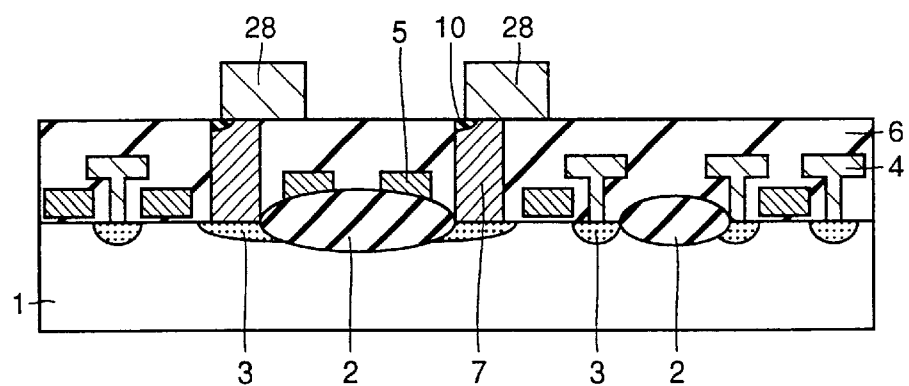
FIG. 5 is a cross sectional view in accordance with the first embodiment in a step in which an insulating member is provided in the vicinity of the extended portion of the upper surface of the conducting plug.

Referring to FIG. 5, thereafter, annealing at 550° C.×60 sec. is performed in an oxidizing atmosphere at a normal pressure by a lamp annealing apparatus, and in the vicinity of the end portion of the upper surface of the exposed conducting plug, an insulating layer formed of $TiO_2$ or $SiO_2$ or a mixture thereof is formed. The oxidizing atmosphere at this time is not limited to oxygen, provided that an oxide layer is formed on the exposed conducting plug. For example, $N_2O$, NO, $NO_2$, $H_2$, $H_2O$, $O_3$ or HCl may be used. Further, the temperature and time are not limited, either. Further, a diffusion furnace or the like may be used. Plasma processing may be utilized for the oxidizing process. In the plasma processing, similar oxidizing effect is attained by oxygen plasma processing at a room temperature under the conditions of gas: oxygen, pressure: 100 Pa, power: 300W and processing time: 30 minutes. In this case also, the gas is not limited to oxygen, and the aforementioned gases may be used as an oxidizing seed. Further, plasma conditions such as temperature, power and processing time are not limited to those mentioned above.

Figure 6:
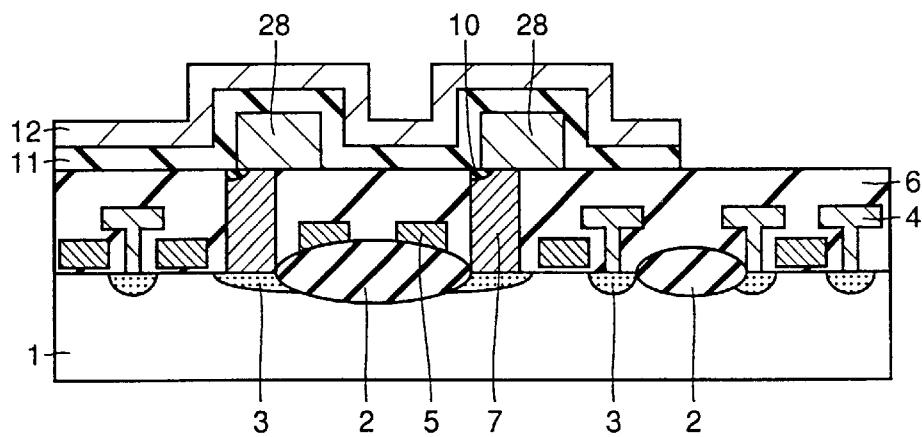
FIG. 6 is a cross sectional view in accordance with the first embodiment in the step in which the capacitor is completed.

Thereafter, referring to FIG. 6, a BST (Barium Strontium Titanate) film 11 as a capacitor dielectric is formed and thereafter, a Pt film 12 as a capacitor upper electrode are formed thereon, respectively to the thickness of 50 nm, by sputtering, for example, whereby the capacitor is formed. The film forming conditions at this time are as follows. For the BST film, temperature: 400° C., atmosphere: $(Ar/O_2)$= (3/1), total pressure: 1.0 Pa, and power: RF power 1.2 kW. For the Pt film, temperature: 200° C., atmosphere: Ar, pressure: 0.2 Pa and power: RF power 2 kW. The method of film forming and conditions for film forming are not limited to those listed above both for BST and Pt films. Further, other materials may be used provided that requirements of electrical conductivity, dielectric constant and so on are satisfied.

Figure 7:
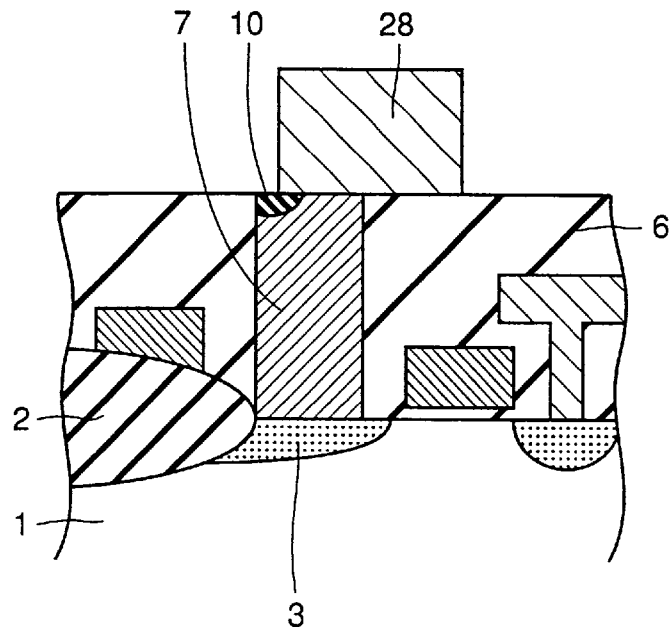
FIGS. 7 and 8 show positional relation between the capacitor lower electrode and the conducting plug of the semiconductor device in accordance with the present invention.

The present embodiment addresses a situation where the aforementioned end portion of the upper surface of the conducting plug has a portion extending out from the outer peripheral line of the upper surface of the capacitor lower electrode when viewed two-dimensionally, as shown in FIG. 7. A situation where the aforementioned end portion of the upper surface of the conducting plug is within the region of the upper surface of the capacitor lower electrode when viewed two-dimensionally represents the positional relation of FIG. 8. The present invention encompasses both situations shown in FIGS. 7 and 8.

In the first embodiment described above, the BST film 11 forming the capacitor dielectric opposes to the reducing material 9 of the conducting plug with a sufficiently thick oxide layer 10 interposed. Therefore, even when subjected to a thermal processing in the process subsequent to the formation of the capacitor, BST film 11 is not reduced, and superior insulation can be maintained.

Second Embodiment

Figure 9:
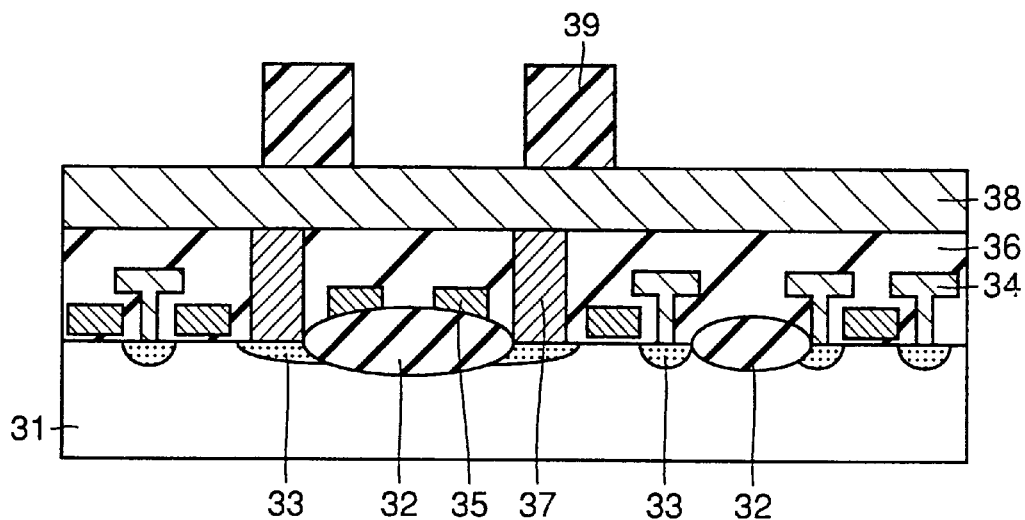
FIG. 9 is a cross sectional view of the semiconductor device in accordance with a second embodiment of the present invention in a step in which the capacitor lower electrode layer and the resist pattern are formed.

The second embodiment will be described in the following. FIG. 9 shows a structure in the step in which a resist pattern 39 for the capacitor lower electrode for forming the capacitor lower electrode is formed by lithography, after a Pt film 38 for the capacitor lower electrode is formed. The structure of this intermediate step includes a semiconductor substrate 31, an isolating insulating film 32, an active region 33, a word line 34, a bit line 35, an interlayer insulating film 36 and a conducting plug 37.

Figure 10:
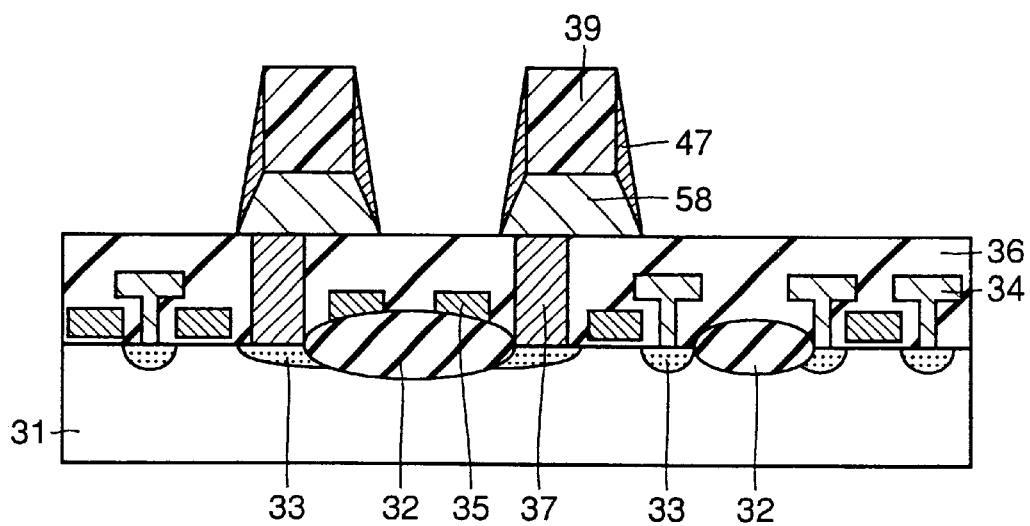
FIG. 10 is a cross sectional view in accordance with the second embodiment in the step in which the lower electrode layer is etched to be tapered, using the resist pattern as a mask.

Next, referring to FIG. 10, using resist pattern 39 for the capacitor lower electrode as a mask, the Pt film 38 is etched by using a helicon etcher, for example, under the following conditions: temperature: 200° C., atmosphere: $(Ar/Cl_2/CF_4)$ and total pressure: 1.0 Pa. By etching under such conditions, deposition film 47 of Pt which has been once etched and vaporized is re-deposited on side surfaces of the resist pattern for the capacitor lower electrode and the capacitor lower electrode layer which is being etched. Therefore, capacitor lower electrode 58 after completion of etching comes to have a shape widening downward. More specifically, the side surface of the capacitor lower electrode comes to have a taper angle of 60° to 88°.

The tapered shape can be more easily attained by a Pt film as compared with the Ru film. If etching is performed to attain the tapered shape more positively, the conditions should be as follows. Temperature: RT to 150° C., atmosphere: $Ar/O_2$ ($O_2$ concentration: 0 to 100%), total flow rate: 50 to 400 sccm and pressure: 10 to 50 mTorr. For comparison, in order to obtain a Pt film with vertical shape, the condition should be as follows. Temperature: 400° C., atmosphere: $Ar/O_2$ ($O_2$ concentration: 20 to 100%), total flow rate: 50 to 400 sccm and pressure: 10 to 50 mTorr.

Figure 11:
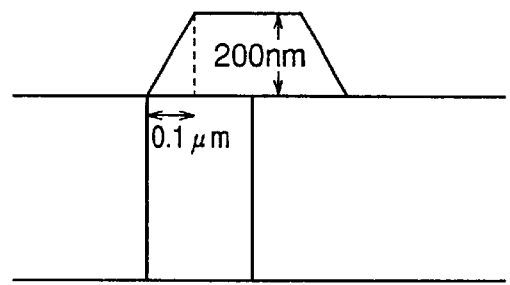
FIG. 11 is a schematic cross section in accordance with the second embodiment in which the tapered capacitor lower electrode covers the exposed part of conducting plug.

The taper angle refers to an angle formed by an extension of the upper surface of the capacitor lower electrode and the side surface, in the cross section of FIG. 10. When the taper angle of 60°, for example, is attained by the etching, it becomes possible to cover the plug surface by the portion extending wider downward, even when the upper surface of the conducting plug is extended by at most 0.1 µm from the outer peripheral line of the upper surface of the capacitor lower electrode because of misregistration in lithography, as can be seen from FIG. 11. If the taper angle is too large, there will be a bridging with an adjacent pattern during fine processing. Therefore, too large the angle is not preferable.

Figure 12:
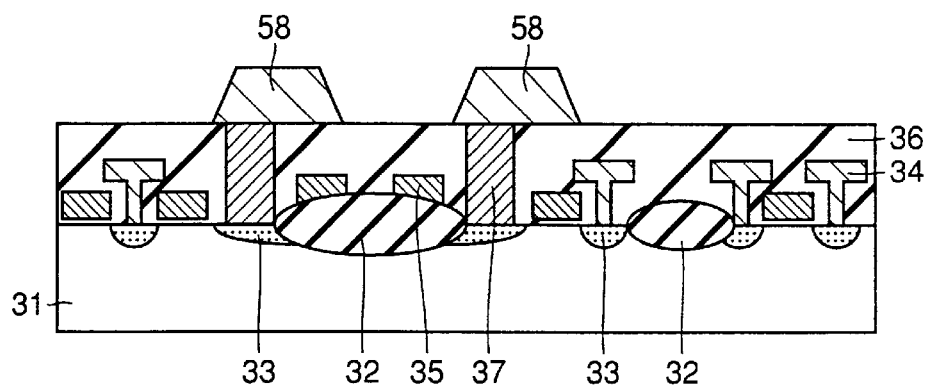
FIG. 12 is a cross sectional view in accordance with the second embodiment in a step in which the tapered capacitor lower electrode is formed.

Thereafter, referring to FIG. 12, resist pattern 39 is removed. At this time, the deposited film 47 on the side surface of the resist may be left unremoved. In such a case, the film may be removed by wet etch using HCl or the like.

Figure 13:
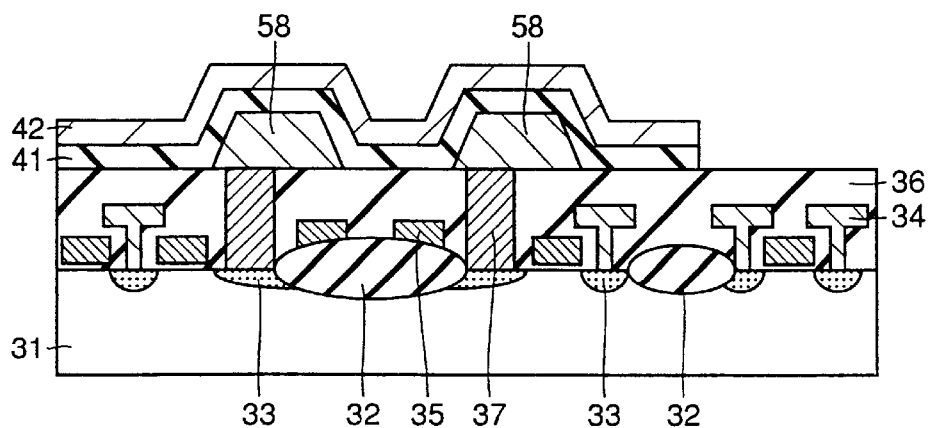
FIG. 13 is a cross sectional view in accordance with the second embodiment in the step in which the capacitor is formed on the tapered capacitor lower electrode.

Thereafter, referring to FIG. 13, a BST film 41 as the capacitor dielectric and a Pt film 42 as the capacitor upper electrode are formed in the similar manner as the first embodiment.

Figure 14:
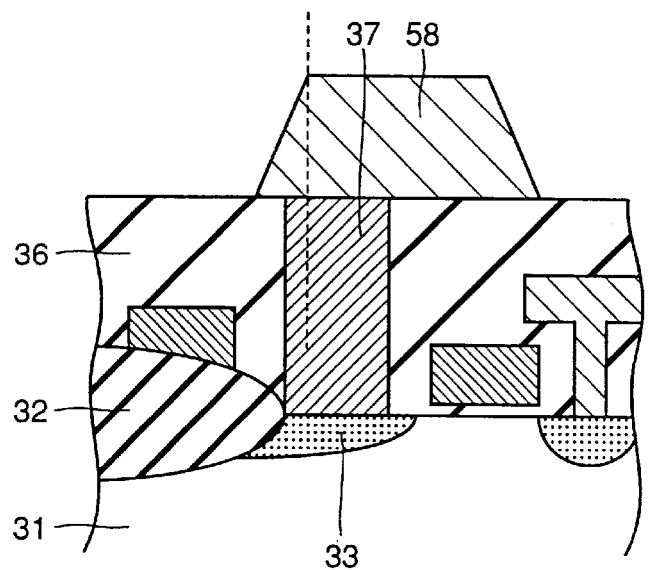
FIGS. 14 and 15 show positional relation between the capacitor lower electrode and the conducting plug of the semiconductor device in accordance with the present invention.
Figure 15:
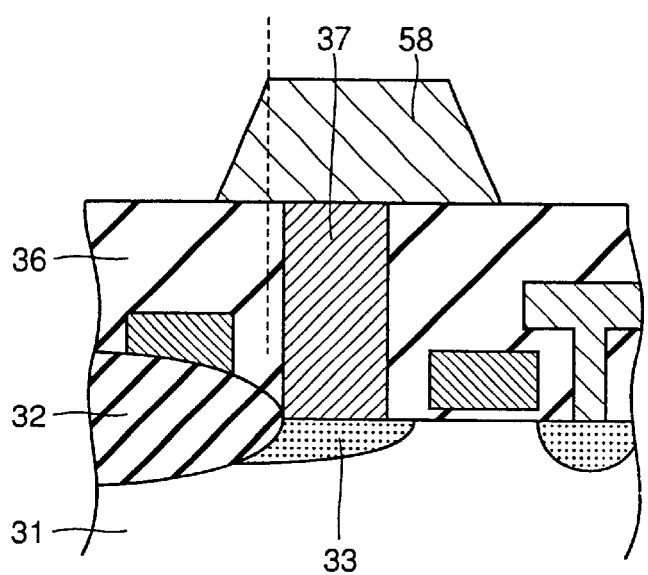

In the second embodiment, the end portion of the upper surface of the conducting plug has a portion exceeding the outer peripheral line of the upper surface of the capacitor lower electrode when viewed two-dimensionally as shown in FIG. 14. A situation where the end portion of the upper surface of the conducting plug is within the region of the upper surface of the capacitor lower electrode represents the positional relation of FIG. 15. It goes without saying that the present invention covers both situations of FIGS. 14 and 15.

In the second embodiment, BST film 41 opposes to the reducing material 37 of the conducting plug with a sufficiently thick Pt film interposed, and separated by a sufficient distance. Therefore, even when subjected to a thermal processing in a process subsequent to the capacitor formation, the BST film is not reduced, and superior insulation can be maintained. Further, as compared with the first embodiment, since there is not an oxide layer as an insulator on the upper surface of the conducting plug, contact resistance between the conducting plug 37 and capacitor lower electrode 58 formed of the Pt film can be suppressed.

When the capacitor lower electrode layer is of Ru, which is a precious metal as Pt, it is possible to make side surfaces of the capacitor lower electrode tapered by adopting the following etching conditions for the capacitor lower electrode layer. Etching gas: a mixed gas of oxygen and chlorine with chlorine concentration of 2.5 to 20%, total gas flow rate: at least 400 sccm, discharge pressure: 10 to 50 mTorr, gas residence time: at most 45 msec.

The magnitude of the taper angle is determined by two factors, that is, the length of the gas residence time and gas concentration (pressure). Therefore, it is desirable to define the taper angle by the gas residence time and the pressure. The flow rate is in reverse proportion to the gas residence time, and therefore the flow rate is determined uniquely once the gas residence time is determined. Therefore, it is difficult to control the taper angle using the total gas flow rate only as an index, because the gas residence time varies dependent on the evacuation rate, even if the taper angle is to be controlled by the total gas flow rate.

Third Embodiment

Figure 16:
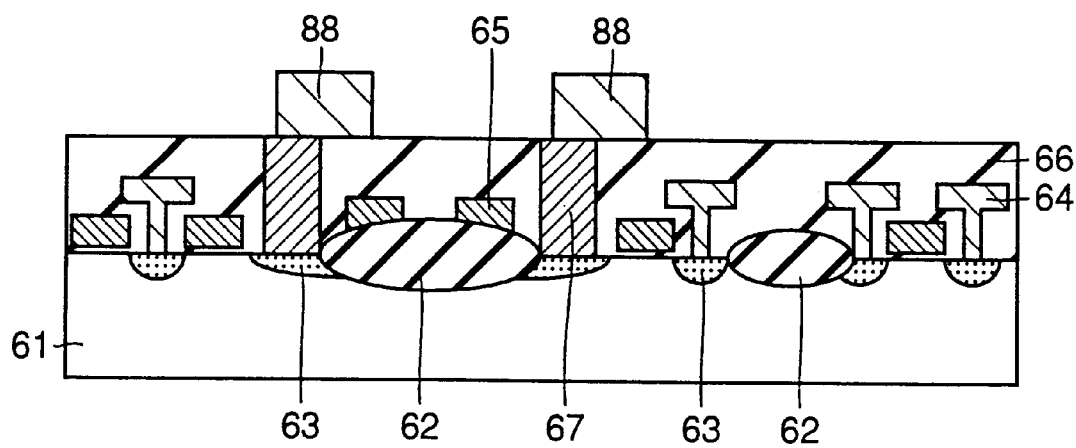
FIG. 16 is a cross sectional view of the semiconductor device in accordance with a third embodiment of the present invention in a step where the capacitor lower electrode is formed.

The third embodiment will be described in the following, FIG. 16 shows a structure in the step where a capacitor lower electrode 88 of a Pt film is formed, after a conducting plug 67 is formed in a contact hole penetrating through the interlayer insulating film 66. The structure of this intermediate step includes a semiconductor substrate 61, an isolating insulating film 62, an active region 63, a word line 64, a bit line 65, an interlayer insulating film 66, a conducting plug 67 and a capacitor lower electrode 88.

Figure 17:
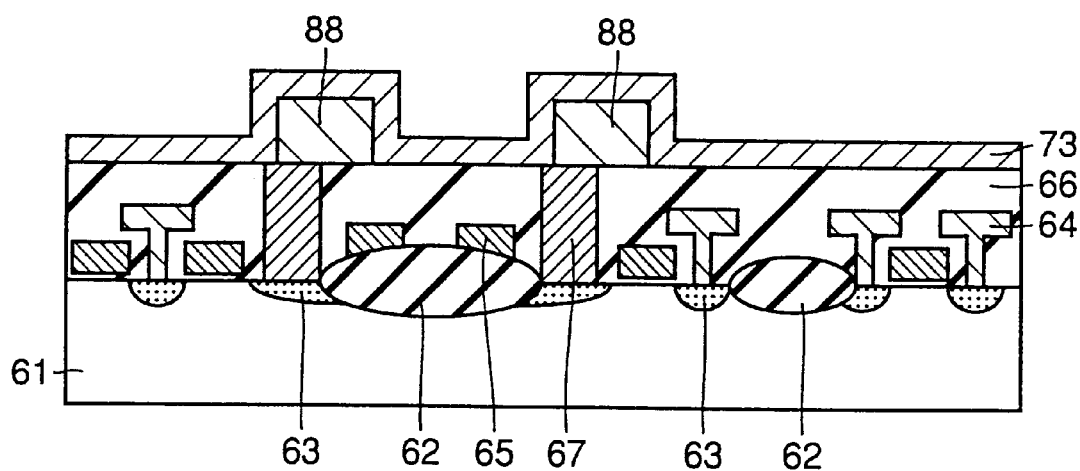
FIG. 17 is a cross sectional view in accordance with the third embodiment in a step in which a Pt layer is formed.

Thereafter, referring to FIG. 17, a Pt film 73 is formed by sputtering, for example, on interlayer insulating film 66 and capacitor lower electrode 88 to the thickness of 100 nm under the following conditions. Temperature: 200° C., atmosphere: Ar. Pressure: 0.2 Pa and power: 1 kW. When the film thickness here is made thicker, a thick sidewall extension of the Pt film is obtained in the subsequent step of forming the sidewall extension, and it becomes easier to cover the exposed upper surface of the conducting plug. However, if the thickness is too large, it may be difficult to separate the extension from an adjacent pattern. Therefore, it is necessary to adopt an optimal film thickness in accordance with the size of the exposed portion of the upper surface of the conducting plug.

Figure 18:
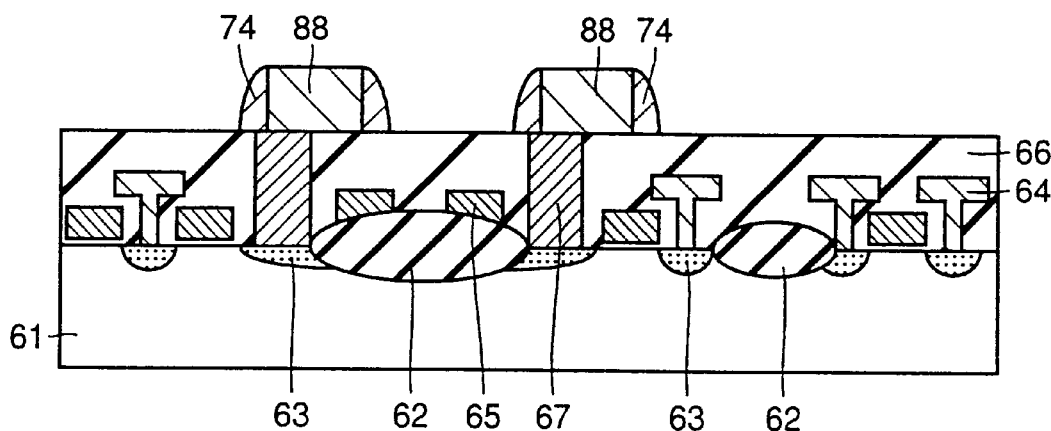
FIG. 18 is a cross sectional view in accordance with the third embodiment in a step in which the Pt layer is etched back and a sidewall extension is formed on a side surface of the capacitor lower electrode.

Thereafter, referring to FIG. 18, the Pt film is entirely etched back by using a helicon etcher under the conditions of: temperature: 200° C., atmosphere: $(Ar/Cl_2)$, and total pressure: 1.0 Pa, whereby a sidewall extension 74 of Pt is formed on a sidewall portion of the capacitor lower electrode to cover the exposed upper surface of the conducting plug.

Figure 19:
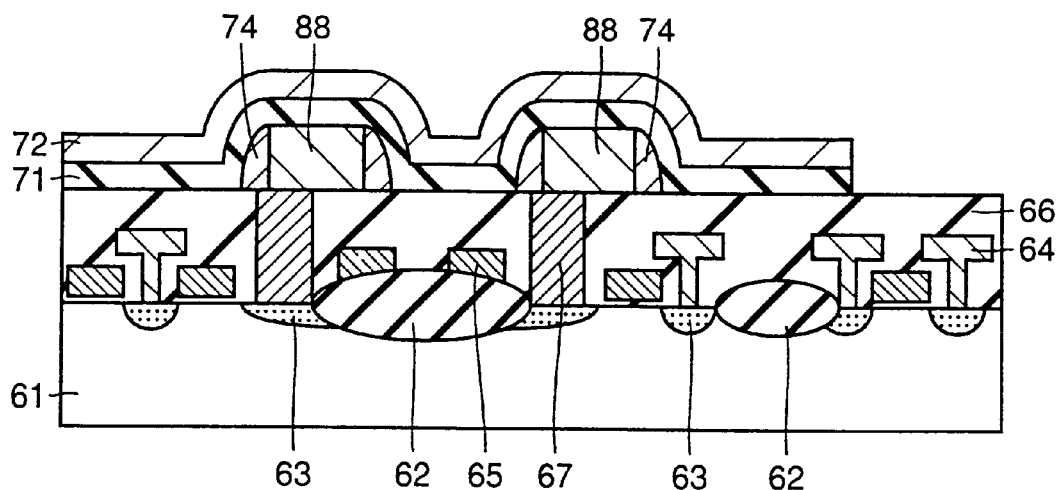
FIG. 19 is a cross sectional view in accordance with the third embodiment in a step in which the capacitor is completed.

Thereafter, referring to FIG. 19, a BST film 71 as a capacitor dielectric and a Pt film as the capacitor upper electrode are formed in the similar manner as in the first embodiment, and the capacitor is completed.

Figure 20:
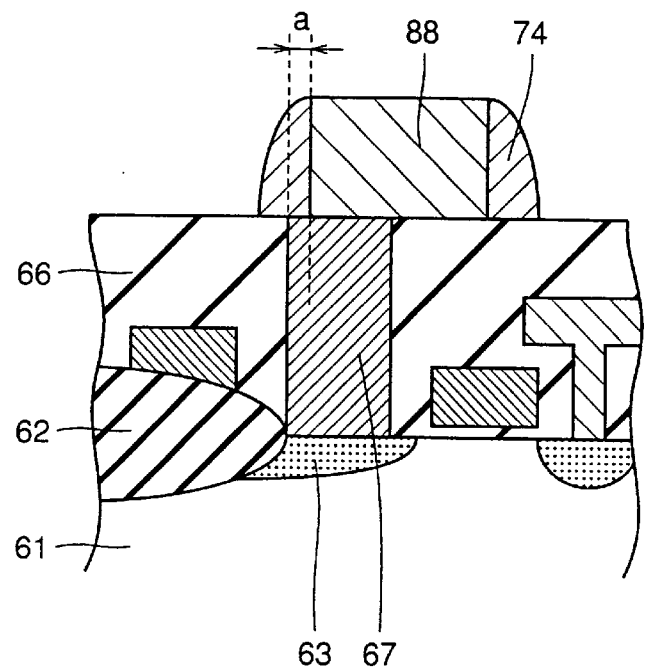
FIGS. 20 and 21 show positional relation between the capacitor lower electrode and the conducting plug of the semiconductor device in accordance with the present invention.

The present embodiment addresses a situation where the end portion of the upper surface of the conducting plug has a portion exceeding the outer peripheral line of the upper surface of the capacitor lower electrode when viewed two-dimensionally, as shown in FIG. 20. A situation where the end portion of the upper surface of the conducting plug is within the region of the upper surface of the capacitor lower electrode when viewed two-dimensionally represents the positional relation of FIG. 21. The range of a in FIG. 20 is not limited as far as it is a positive value. By contrast, the range of b of FIG. 21 should preferably be 0 to 0.1 µm, in view of the necessity to provide an insulation layer. It goes without saying that the present invention covers both situations of FIGS. 20 and 21.

In the third embodiment, BST film 71 as the capacitor dielectric opposes to the reducing conducting plug 67 with a sufficiently thick chemically inactive member interposed, and separated by a sufficient distance. Therefore, even when subjected to a thermal processing in a process subsequent to the capacitor formation, the BST film is not reduced. Therefore, superior insulation can be maintained. Further, as compared with the first embodiment, it is not necessary to provide an oxide layer on the upper surface of the conducting plug 67. Therefore, contact resistance at an interface between capacitor lower electrode 88 of Pt and conducting plug 67 can be suppressed. Further, the semiconductor devices in accordance with the second and third embodiments are common in that the lower side of the capacitor lower electrode is enlarged. The third embodiment, however, has an advantage that control of the dimension of the lower electrode is facilitated by the formation of the sidewall extension.

Fourth Embodiment

Figure 22:
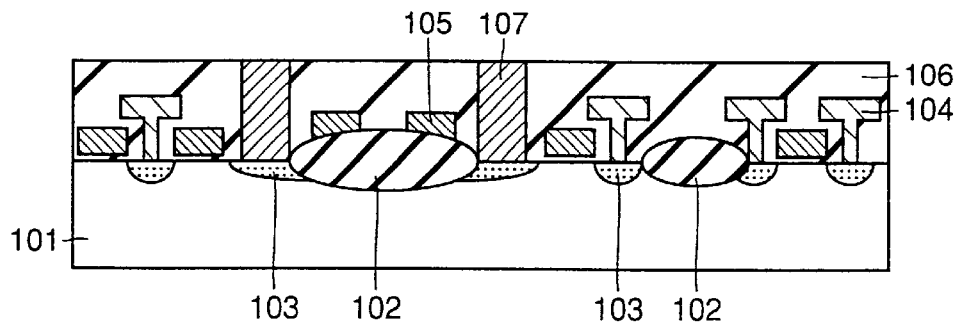
FIG. 22 is a cross sectional view of the semiconductor device in accordance with the fourth embodiment of the present invention in a step in which the capacitor underlying structure is formed.

The fourth embodiment will be described in the following. FIG. 22 shows a structure in a step where a conducting plug 107 is formed in a contact hole penetrating through an interlayer insulating film 106. The structure shown in FIG. 22 includes a silicon substrate 101, an isolating insulating film 102, an active region 103, a word line 104, a bit line 105 and an interlayer insulating film 106. Conducting plug 107 is formed of an impurity doped polysilicon. In FIG. 22, the well structure formed in the substrate is not shown.

Figure 23:
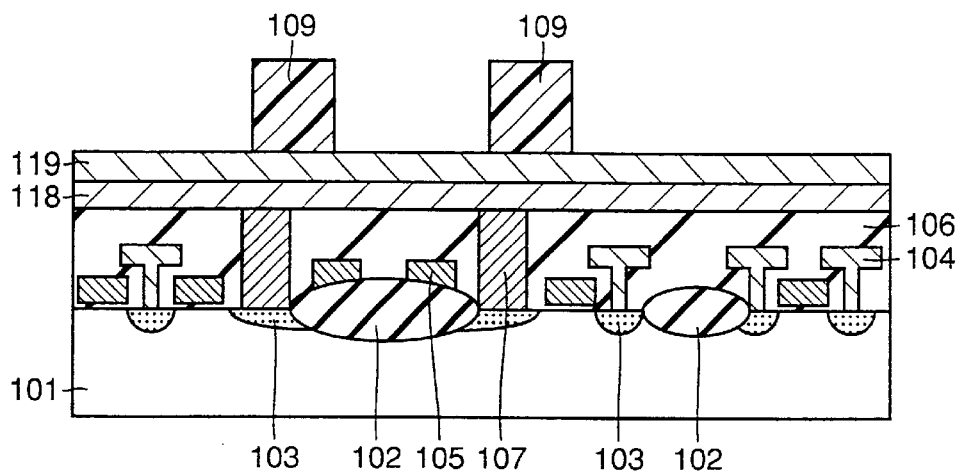
FIG. 23 is a cross sectional view in accordance with a fourth embodiment in a step in which the resist pattern for the capacitor lower electrode layer is formed.

Referring to FIG. 23, on interlayer insulating film 106 and conducting plug 107, a barrier metal layer 118 containing Si, Ti or N as a main component is formed and a Pt film 119 is formed further thereon. Barrier metal layer 118 is formed by sputtering, for example, to the thickness of 100 nm under the following conditions. Temperature: 300° C., atmosphere: $(Ar/N_2)=(1/1)$, total pressure: 0.2 Pa, power: 1 kW. The film forming conditions are not limited and other conditions may be used. Pt film 119 is formed by sputtering to the thickness of 100 nm under the following conditions. Temperature: 200° C., atmosphere: Ar, pressure: 0.2 Pa and power: 1 kW. The method of formation is not limited to sputtering, and an impurity such as oxygen may be introduced to Pt. Further, materials other than Pt may be used provided that requirements such as stability against oxygen and electrical conductivity are satisfied. Thereafter, a prescribed resist pattern 109 for the capacitor lower electrode is formed by lithography.

At this time, because of misregistration in lithography, an end portion of the upper surface of the conducting plug may be positioned exceeding vertically the edge of the lower electrode resist pattern, as shown in FIG. 23.

Figure 24:
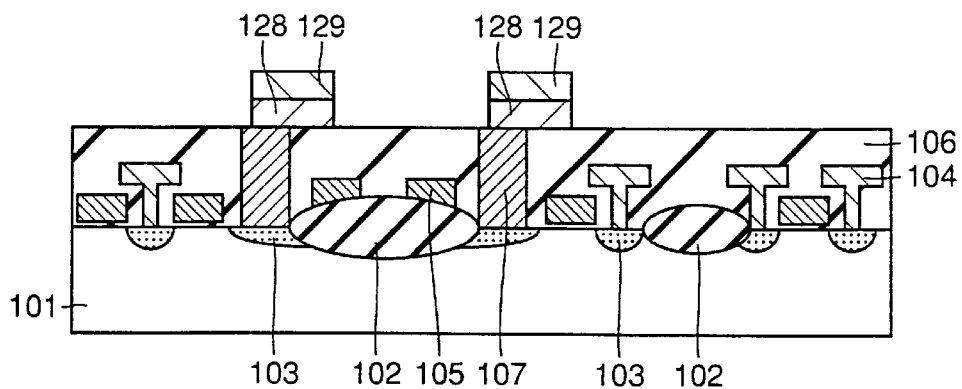
FIG. 24 is a cross sectional view in accordance with the fourth embodiment in a step in which the capacitor lower electrode is formed.

Thereafter, referring to FIG. 24, using resist pattern 109 for the lower electrode as a mask, Pt film 119 and barrier metal layer 118 are etched so that the capacitor lower electrode including Pt film 129 and barrier metal layer 128 is formed. The etching condition at this time are as follows, using a helicon etcher. Temperature: 200° C., atmosphere: $(Ar/Cl_2)$ and total pressure: 1.0 Pa. When there is misregistration of lithography mentioned above, the end portion of the upper surface of conducting plug 107 is exposed after etching. Further, no matter whether there is a misregistration or not in lithography, the side surface of barrier metal layer 128 is exposed.

Figure 25:
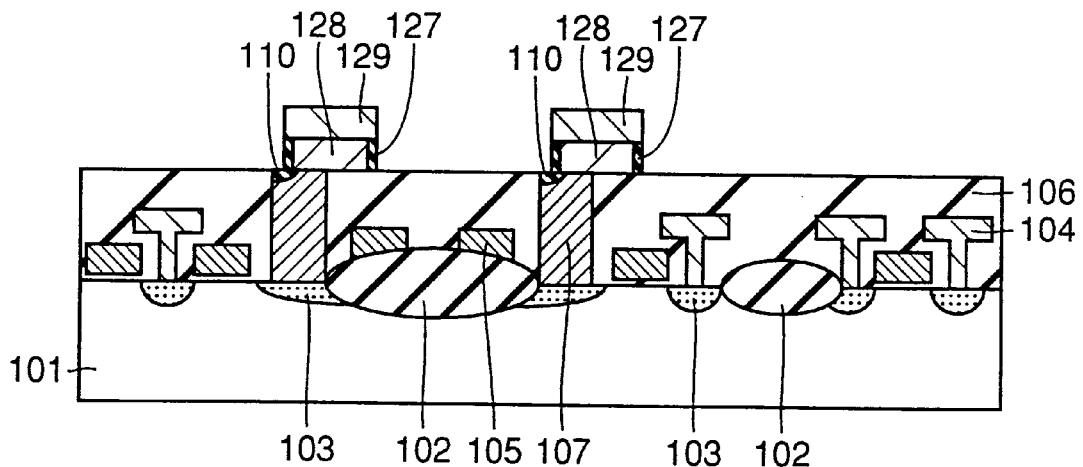
FIG. 25 is a cross sectional view in accordance with the fourth embodiment in a step in which an insulating member is formed on the extended portion of the upper surface of the conducting plug and on the side surface of the barrier metal.

Thereafter, referring to FIG. 25, annealing at 550° C.×60 sec. is performed in an oxidizing atmosphere at a normal pressure by a lamp annealing device, and insulating layers 110 and 127 formed of $TiO_2$ or $SiO_2$ or a mixture thereof is formed on the exposed upper surface of the conducting plug and on the sidewall of the barrier metal. The oxidizing atmosphere at this time is not limited to oxygen, provided that an oxide film layer is formed. $N_2O$, NO, $NO_2$, $H_2O$, $O_3$, HCl or the like may be used as an oxidizing atmosphere. The temperature, time and so on for the oxidizing process are not limited, and a diffusion furnace may be used. Further, as a method of oxidization, plasma processing may be utilized. In that case, similar oxidizing effect as the oxidizing process described above can be attained by oxygen plasma processing at a room temperature under the conditions of atmosphere: $O_2$, pressure: 100 Pa, power: 300W and time: 30 minutes. In this case also, the aforementioned gases may be used as oxidizing seed. Further, conditions of plasma processing are not limited to those described above.

Figure 26:
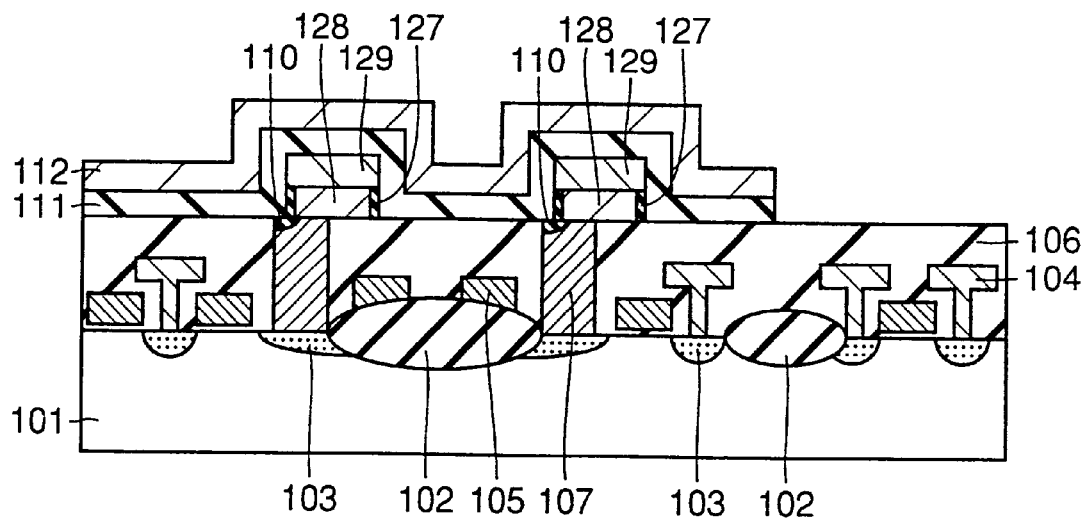
FIG. 26 is a cross sectional view in accordance with the fourth embodiment in a step in which the capacitor is completed.

Thereafter, referring to FIG. 26, by RF magnetron sputtering, for example, BST film 111 as the capacitor dielectric and a Pt film 112 as the capacitor upper electrode are respectively formed to the thickness of 50 nm, and the capacitor is completed. The conditions for film formation at this time are as follows. For BST film 111, for example, temperature: 400° C., atmosphere: $(Ar,/O_2)=(3/1)$, total pressure: 1.0 Pa, power: RF power 1.2 kW. For Pt film 112, temperature: 200° C., atmosphere: Ar, pressure: 0.2 Pa and power: RF power 2 kW. The film forming conditions for the BST film 111 and Pt film 112 are not limited to those described above. Other conditions may be used provided that films of comparable property as those formed under the above described conditions can be obtained.

Figure 8:
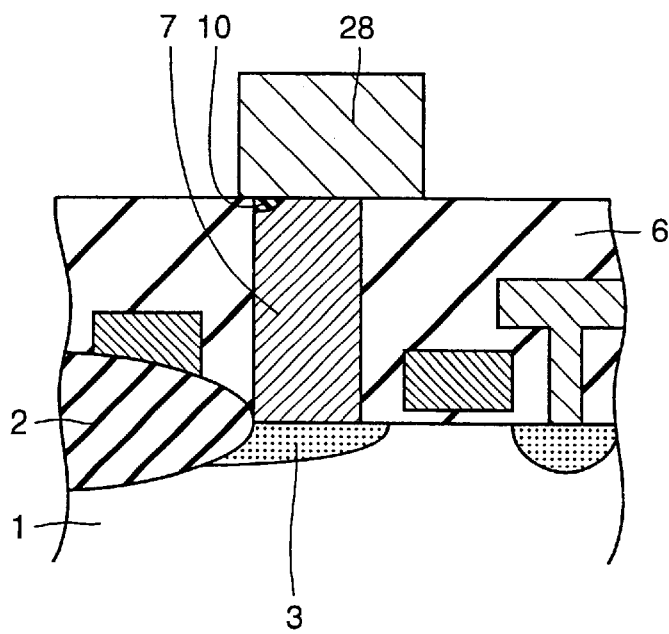

As to the positional relation between the upper surface region of the capacitor lower electrode and the upper surface of the conducting plug, the positional relation shown in FIGS. 7 and 8 described with reference to the first embodiment having a single layered structure also applies to the present embodiment in which the capacitor lower electrode has a two-layered structure.

In the fourth embodiment, BST film 111 of the capacitor dielectric opposes to the reducing conducting plug 107 and barrier metal 128 with oxide layers 110 and 127 interposed, separated by a sufficient distance. Therefore, even when subjected to a thermal processing in a process subsequent to the formation of the capacitor, BST film 111 is not reduced, and superior insulation can be maintained.

Fifth Embodiment

Figure 27:
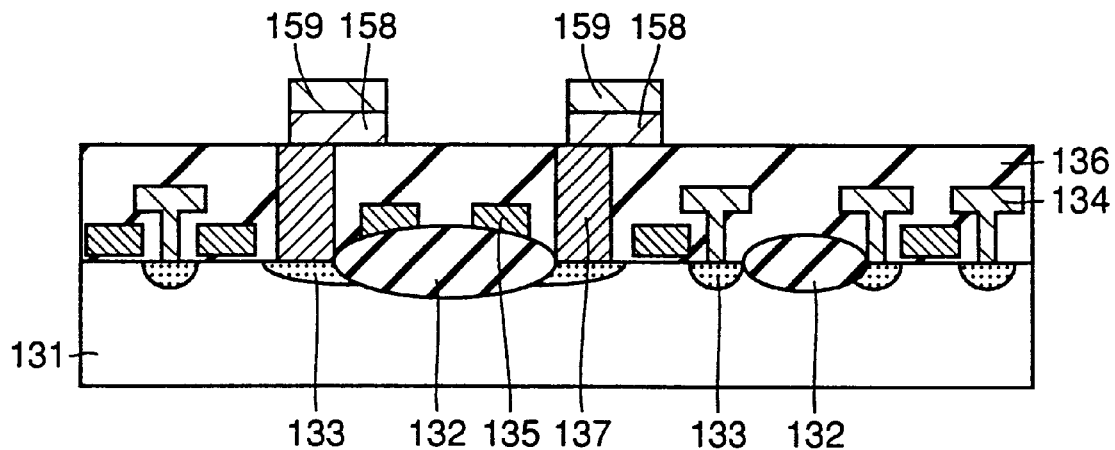
FIG. 27 is a cross sectional view of the semiconductor device in accordance with a fifth embodiment in a step in which the capacitor lower electrode is formed.

The fifth embodiment will be described in the following. FIG. 27 shows a structure in the step in which the capacitor lower electrode including a barrier metal 158 and a Pt film 159 is formed by etching the barrier metal layer and the Pt film, using the resist pattern for the capacitor lower electrode as a mask. The structure of the step shown in FIG. 27 includes a silicon substrate 131, an isolating insulating film 132, an active region 133, a word line 134, a bit line 135, an interlayer insulating film 136, a conducting plug 137 and a capacitor lower electrode formed of a barrier metal layer 158 and a Pt film 159. Because of the increased degree of miniaturization of the semiconductor device, an end at an upper surface of the conducting plug is exposed, due to misregistration in lithography, as shown in FIG. 27.

Figure 28:
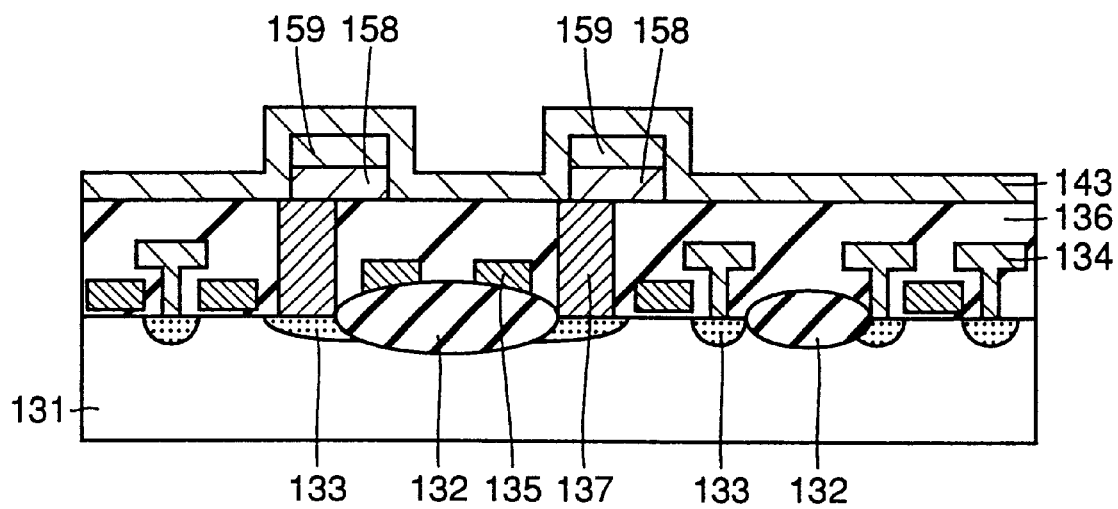
FIG. 28 is a cross sectional view in accordance with the fifth embodiment in a step in which a Pt film is formed.

Referring to FIG. 28, on interlayer insulating film 136 and the capacitor lower electrode having the aforementioned two-layered structure, a Pt film 143 is formed, for example, by sputtering, to the thickness of 100 nm under the following conditions. Temperature: 200° C., atmosphere: Ar, pressure: 0.2 Pa and power: 1 kW. If the thickness here is made thicker, a thick sidewall extension of Pt film can be obtained in the subsequent step of forming the sidewall extension, and it becomes easier to cover the end portion of the upper surface of the conducting plug which has an exposed portion. At the same time, however, separation from an adjacent pattern tends to be more difficult. Therefore, an optimal film thickness must be selected at the exposed portion of the conducting plug.

Figure 29:
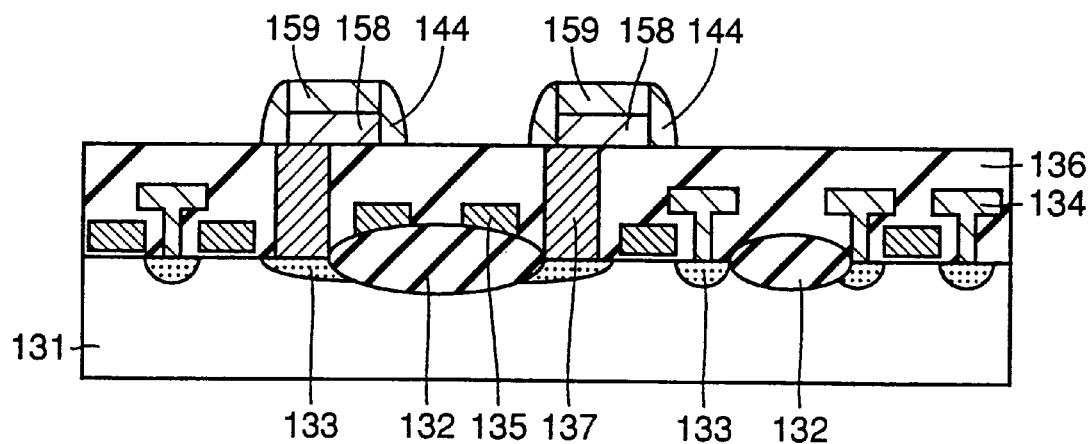
FIG. 29 is a cross sectional view in accordance with the fifth embodiment in a step in which the Pt film is etched back and the sidewall extension is formed.

Thereafter, referring to FIG. 29, the Pt film 143 is etched back entirely by using a helicon etcher under the conditions of temperature: 200° C., atmosphere: $(Ar/Cl_2)$ and total pressure: 1.0 Pa, whereby a sidewall extension 144 of Pt is formed on the sidewall of the capacitor lower electrode, to cover the exposed portion of the conducting plug.

Figure 30:
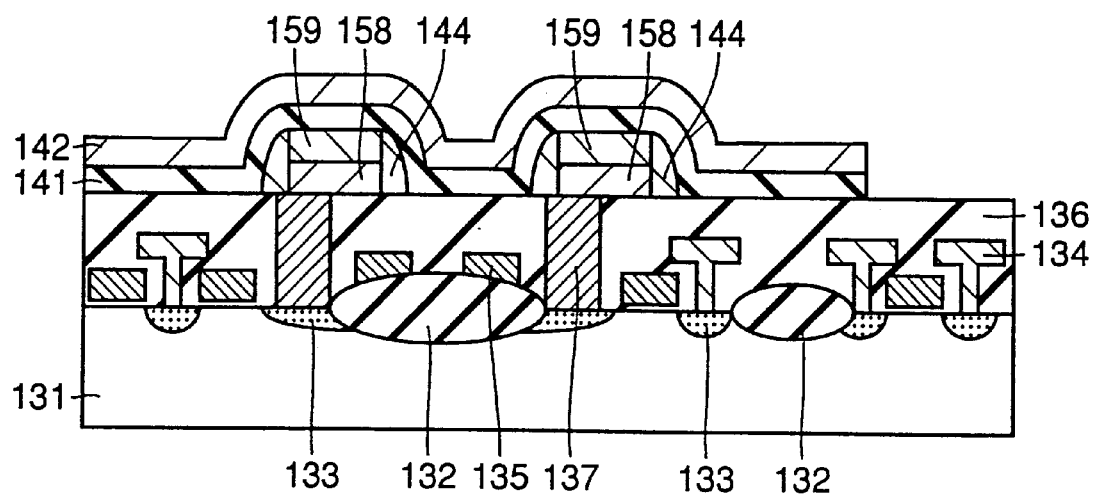
FIG. 30 is a cross sectional view in accordance with the fifth embodiment in a step in which the capacitor is completed.

Thereafter, referring to FIG. 30, a BST film 141 as the capacitor dielectric and a Pt film 142 as a capacitor upper electrode are formed in the similar manner as in the first embodiment.

Figure 21:
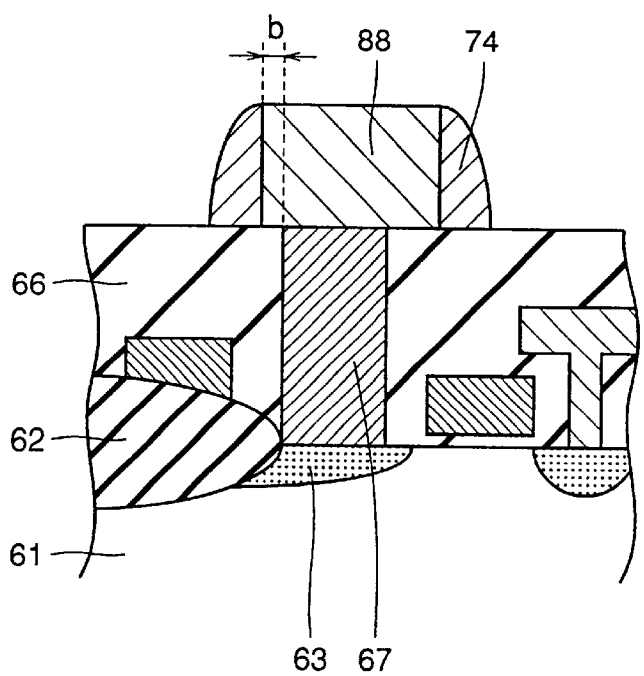

As to the positional relation between the upper surface of the capacitor lower electrode and the upper surface of the conducting plug, the positional relation shown in FIGS. 20 and 21 described with reference to the third embodiment having a single layered structure also applies to the fifth embodiment in which the capacitor lower electrode has the two-layered structure.

In the fifth embodiment, BST film 141 is separated from the reducing material of conducting plug 137 as well as from barrier metal 158 by a sufficiently thick Pt film. Therefore, even when subjected to a thermal processing in a process subsequent to the formation of the capacitor, the BST film is not reduced, and superior insulation can be ensured. Further, as compared with the fourth embodiment, there is no oxide layer on the upper surface of the conducting plug, and therefore contact resistance between the conducting plug and capacitor lower electrodes 158 and 158 can be advantageously suppressed.

Sixth Embodiment

Figure 31:
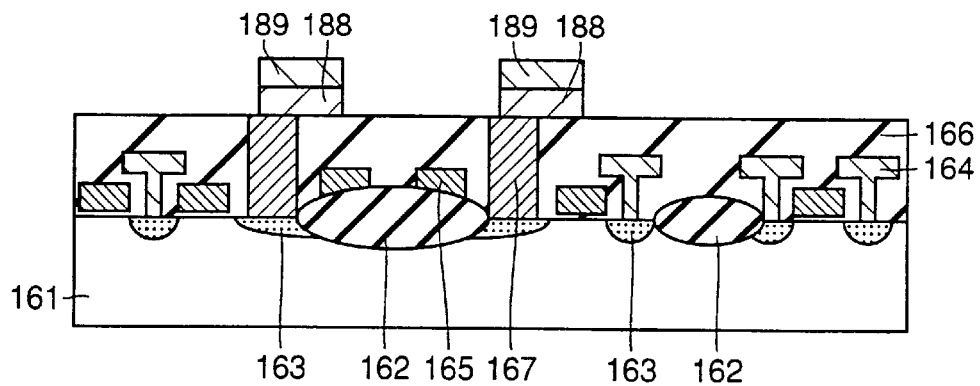
FIG. 31 is a cross sectional view of the semiconductor device in accordance with a sixth embodiment in a step in which the capacitor lower electrode is formed.

The sixth embodiment will be described in the following. FIG. 31 shows a structure in the step in which the barrier metal layer and the Pt film are etched by using the resist pattern for the capacitor lower electrode as a mask, so that the capacitor lower electrode including a barrier metal 188 and a Pt film 189 is formed. The structure of the intermediate step of FIG. 31 includes a silicon substrate 161, an isolating insulating film 162, an active region 163, a word line 164, a bit line 165, an interlayer insulating film 166 and a capacitor lower electrode including barrier metal 188 and Pt film 189.

Figure 32:
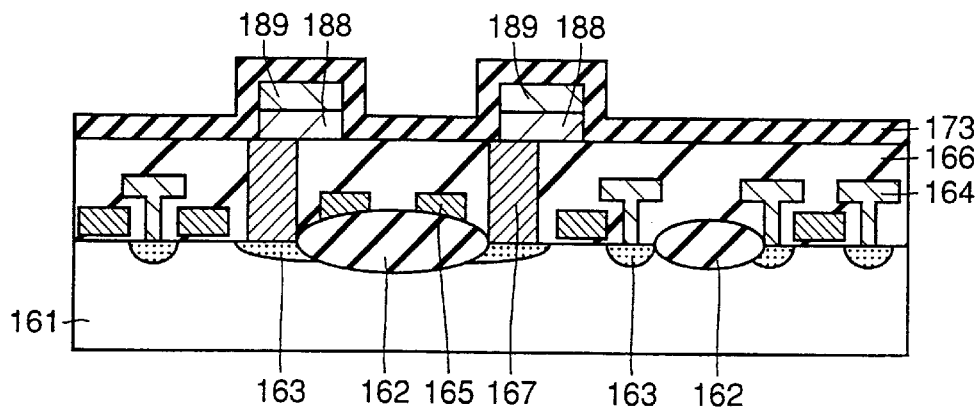
FIG. 32 is a cross sectional view in accordance with the sixth embodiment in a step in which a silicon oxide film is formed.

Thereafter, referring to FIG. 32, on interlayer insulating film 166 and the capacitor lower electrode, a silicon oxide film 173 is formed to the thickness of 100 nm by normal pressure CVD, for example. Though a silicon oxide film is used, a silicon nitride film or the like may be used, provided that it is an insulating film. If the film is made thicker at this time, a thick sidewall extension of silicon oxide film can be obtained in the subsequent step of forming the sidewall extension, and it becomes easier to cover the exposed upper surface of the conducting plug.

Figure 33:
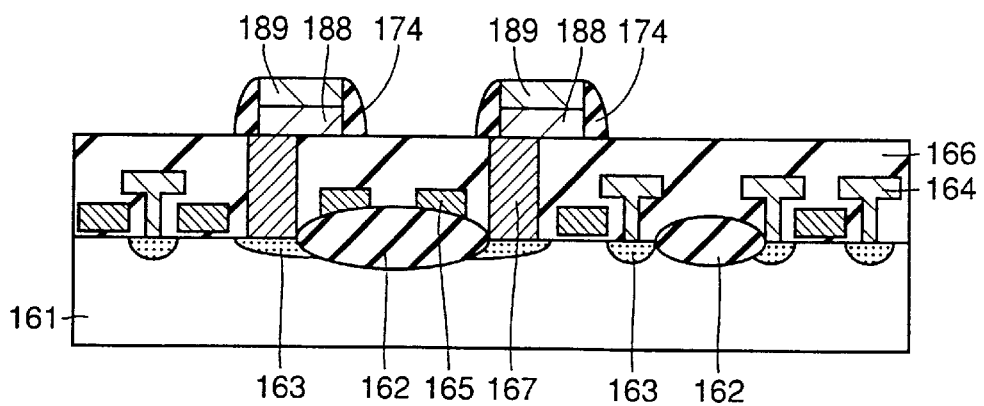
FIG. 33 is a cross sectional view in accordance with the sixth embodiment in a step in which the silicon oxide film is etched back and the sidewall extension is formed.

Thereafter, referring to FIG. 33, silicon oxide film 173 is etched back entirely, thereby a sidewall extension 174 of silicon oxide film is formed on the side surface of the capacitor lower electrode formed of barrier metal 188 and Pt 189, to cover the exposed upper surface of the conducting plug and the side surface of the barrier metal.

Figure 34:
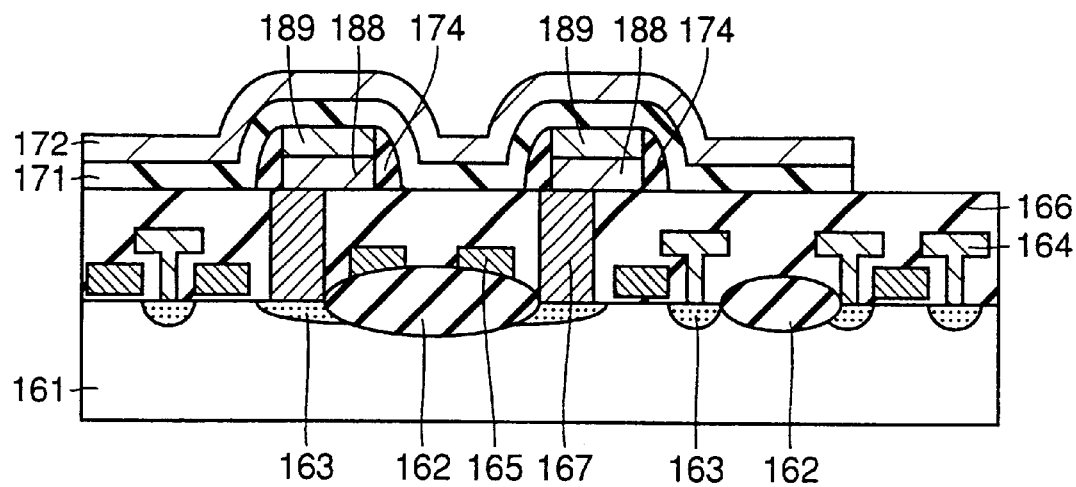
FIG. 34 is a cross sectional view in accordance with the sixth embodiment in a step in which the capacitor is completed.
Figure 35:
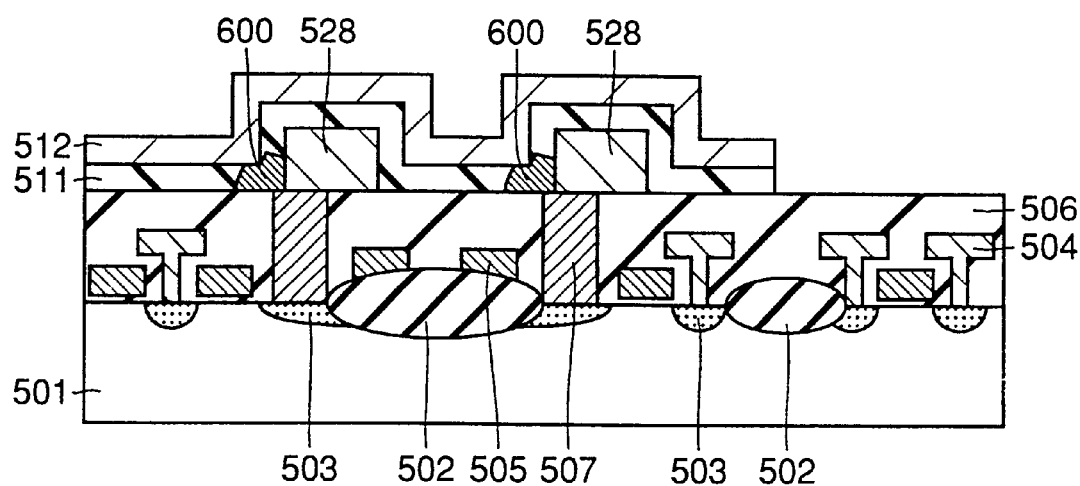
FIG. 35 is a cross sectional view of a conventional semiconductor device.

Thereafter, referring to FIG. 34, a BST film 171 as the capacitor dielectric and a Pt film 172 as the capacitor upper electrode are formed.

As to the positional relation between the upper surface of the capacitor lower electrode and the upper surface of the conducting plug, the positional relation shown in FIGS. 20 and 21 described with reference to the third embodiment which employs a single layered structure also applies to the sixth embodiment in which the capacitor lower electrode has the two-layered structure.

In the sixth embodiment, BST film 171 is separated from the reducing conducting plug 167 and barrier metal 188 by a chemically inactive silicon oxide film having sufficient thickness. Therefore, even when subjected to a thermal processing in a process subsequent to the formation of the capacitor, the BST film is not reduced, and superior insulation can be maintained. Further, as compared with the fifth embodiment, the sidewall of the capacitor lower electrode is covered by an insulator, and therefore a leakage current passing through the sidewall of the capacitor lower electrode can advantageously be suppressed, even when the capacitor dielectric is formed by a method with poor coverage.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device, comprising:

an interlayer insulating film formed on a main surface of a semiconductor substrate;

a conducting plug formed in a contact hole penetrating through said interlayer a capacitor lower electrode formed on said conducting plug and said interlayer insulating film; and a capacitor dielectric formed to cover said capacitor lower electrode and said interlayer insulating film; wherein an end portion of an upper surface of said conducting plug adjacent to a sidewall of said capacitor lower electrode and having a portion overlapping an outer periphery of an upper surface of said capacitor lower electrode when viewed two-dimensionally, and an insulating portion formed in said end portion of the upper surface of said conductive plug to be interposed between and separating said end portion of the upper surface of said conducting plug and said capacitor dielectric.

2. The semiconductor device according to claim 1, wherein said end portion of the upper surface of said conducting plug has a portion extending out from an outer peripheral line of the upper surface of said capacitor lower electrode when viewed two-dimensionally.

3. The semiconductor device according to claim 1, wherein said end portion of the upper surface of said conducting plug is within a region of the upper surface of said capacitor lower electrode when viewed two-dimensionally.

4. The semiconductor device according to claim 1, wherein an insulator which is a compound of a material constituting said conducting plug is formed as said chemically inactive member at said end portion of the upper surface of said conducting plug.

5. The semiconductor device according to claim 1, wherein said capacitor lower electrode tapered to be wider from upper to lower surface covers, as said chemically inactive member, said end portion of the upper surface of said conducting plug.

6. The semiconductor device according to claim 1, wherein a chemically inactive sidewall extension is formed as said inactive member on a side surface of said capacitor lower electrode to cover said end portion of the upper surface of said conducting plug.

7. The semiconductor device according to claim 1, wherein said capacitor lower electrode includes a barrier metal layer and a precious metal layer, and said chemically inactive member is further formed on a sidewall of said barrier metal layer to be interposed between and separating said barrier metal layer and said capacitor dielectric.

8. The semiconductor device according to claim 7, wherein the chemically inactive member formed on the sidewall of said barrier metal layer is an insulator formed of a compound of a material constituting the barrier metal layer formed on the sidewall of said barrier metal layer, and the chemically inactive member formed on said end portion of the upper surface of said conducting plug is an insulator formed of a compound of a material constituting the conducting plug formed on said end portion of the upper surface of said conducting plug.

9. The semiconductor device according to claim 7, wherein said chemically inactive member formed on the sidewall of said barrier metal layer and on said end portion of the upper surface of said conducting plug is a chemically inactive sidewall extension formed on a side surface of the capacitor lower electrode including said barrier metal layer and said precious metal layer so as to cover said end portion of the upper surface of said conducting plug.

* * * * *